United States Patent
Chen et al.

(10) Patent No.: US 7,298,640 B2
(45) Date of Patent: Nov. 20, 2007

(54) 1T1R RESISTIVE MEMORY ARRAY WITH CHAINED STRUCTURE

(75) Inventors: Zheng Chen, Colorado Springs, CO (US); Carlos A. Paz de Araujo, Colorado Springs, CO (US); Larry D. McMillan, Colorado Springs, CO (US)

(73) Assignees: Symetrix Corporation, Colorado Springs, CO (US); Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 11/121,145

(22) Filed: May 3, 2005

(65) Prior Publication Data

US 2005/0248978 A1 Nov. 10, 2005

Related U.S. Application Data

(60) Provisional application No. 60/567,486, filed on May 3, 2004.

(51) Int. Cl.
*G11C 11/00* (2006.01)

(52) U.S. Cl. .................. 365/148; 365/100; 365/104; 365/189.04

(58) Field of Classification Search ............. 365/100, 365/104, 148, 189.04
See application file for complete search history.

(56) References Cited

U.S. PATENT DOCUMENTS

| | | | |
|---|---|---|---|
| 5,313,418 A * | 5/1994 | Wada et al. ............. | 365/104 |
| 6,204,139 B1 | 3/2001 | Liu et al. ................ | 438/385 |
| 6,473,330 B1 | 10/2002 | Ogiwara et al. ......... | 365/145 |
| 6,583,003 B1 | 6/2003 | Hsu et al. ............... | 438/238 |
| 6,841,833 B2 | 1/2005 | Hsu et al. ............... | 257/379 |

\* cited by examiner

*Primary Examiner*—Richard T. Elms
*Assistant Examiner*—Pho M. Luu
(74) *Attorney, Agent, or Firm*—Patton Boggs LLP

(57) ABSTRACT

A 1T1R resistive memory array comprised of chains of memory cells, where each memory cell is composed of a resistive element in parallel with a switch. Such chains of memory cells are non-volatile and provide for each of the memory cells to be randomly accessed.

5 Claims, 7 Drawing Sheets

1T1R RESISTIVE MEMORY ARRAY WITH CHAINED STRUCTURE

CROSS-REFERENCES TO RELATED APPLICATIONS

This application claims priority from U.S. Provisional Patent Application Ser. No. 60/567,486 filed May 3, 2004, the entire teachings of which are herein incorporated by reference.

BACKGROUND OF THE INVENTION

1. Field of the Invention

The principles of the present invention are generally related to resistive memory arrays, and in particular, but not by way of limitation, to a device and method for configuring a resistive memory array, writing and reading from the resistive memory array, and producing the resistive memory array.

2. Description of Related Art

Resistive memory materials have recently been used to produce non-volatile memory cells. Data is stored in the memory cells by changing resistance of the resistive memory materials. Resistive memory materials may include colossal magnetoresistance (CMR) material, high temperature superconductivity (HTSC) materials, or other materials that have a perovskite structure capable of having electrical resistance characteristics altered by external influences. Such external influences may include applying positive and negative or reverse polarity voltages to the resistive memory materials to change the resistance characteristics thereof. The electric field strength or electric current density from one or more pulses is generally sufficient to switch the physical state of the resistive memory materials so as to modify the resistive properties. Alternatively, a pulse with the same polarity, but with different pulse widths, may be utilized to reverse the resistive property of the resistive memory materials previously set. Whichever technique is selected, in applying a pulse to the resistive memory materials, the pulse is to be low enough in energy so as not to destroy or damage the resistive material.

FIG. 1 is a schematic of a resistive memory array 100 provided in U.S. Pat. No. 6,841,833 to Hsu et al. The memory array 100 utilizes a 1-transistor, 1-resistor (1T1R) memory cell configuration and includes sixteen memory cells 102 composed of a resistive memory element in series with a transistor. The memory array 100 includes columns of bit lines BL1-BL4 and rows of word lines WL1-WL4. In addition, a common line CL extends between bit line pairs BL1-BL2 and BL3-BL4 is shared by every two bits (i.e., memory cells) connected between the bit line pairs BL1-BL2 and BL3-BL4. While the memory array 100 is reduced in size by having two bits share a common line CL, the consequence is that the memory array 100 is not a random access memory. Instead, all of the memory cells 102 must be erased before a write operation. By having to erase all of the memory cells, the use of such a resistive memory array 100 is slow and is inefficient.

SUMMARY OF THE INVENTION

To improve size, speed, and efficiency of resistive memory arrays, the principles of the present invention provide for a 1T1R resistive memory array configured as chains of memory cells, where each memory cell is composed of a resistive element in parallel with a switch. Such a configuration is non-volatile and provides for each of the memory cells to be randomly accessed. One embodiment of the principles of the present invention includes an electronic memory including a plurality of memory cells, each memory cell includes a switch and a resistive memory element connected in parallel. The resistive memory element is capable of existing in one of a plurality of resistive states, where each resistive state represents a different data state. The electronic memory further includes a memory write and read circuit selectably coupled to the resistive memory element and capable of writing a data state to the resistive memory element and reading the data state.

Another embodiment includes a method of writing to an electronic memory including a plurality of memory cells, where each memory cell is composed of a resistive memory element. The method includes randomly accessing one of the resistive memory cells and writing data to the randomly accessed resistive memory cell without altering data in any other memory cell.

Yet another embodiment includes an electronic memory including a plurality of memory cells, where each memory cell is composed of a switch connected in parallel with a resistive memory element, a plurality of bit lines may form columns electrically coupling memory cells in series along the bit lines. The memory cells along at least two columns may have substantially the same spacing. A plurality of word lines may form forming rows and be coupled to the switches of the memory cells along the word lines. Circuitry may be coupled to the bit lines and word lines to write and read data to and from at least one memory cell.

Still yet, another embodiment may include an electronic memory cell, including a switch and a resistive memory element coupled in parallel.

Another embodiment may include a method for reading data from an electronic memory having memory cells arranged in rows of word lines and columns of bit lines, each bit line being connected to a column of memory cells having a switch in parallel with a resistive memory element and each word line being connected to switches in rows of the memory cells. The method may include applying a voltage level to all but one word line to turn on each of the switches of the corresponding memory cells, applying a voltage level to the one remaining word line to turn off the switch of the corresponding memory cell to access that memory cell, applying a voltage level to a first side of a bit line of the memory cell being accessed, and sensing the voltage level on the bit line on a second, opposite side of the memory cell being accessed.

An electronic system, including an electronic memory. The electronic memory may include a switch and a resistive memory element coupled in parallel. The system may further include a processor in communication with the memory to write data to and read data from the electronic memory. The electronic system may be a communication device, computing device, or other device that utilizes a memory for storing data.

Yet another embodiment may include a method of manufacturing an integrated circuit electronic memory. The method may include forming a plurality of transistors, forming an insulating layer above the transistors, depositing a resistive material on the insulating layer, etching the resistive material to form a resistive element associated with each of the transistors, etching the insulating layer between the resistive elements to form vias through to the active areas of the transistors, and depositing a conductor in the vias to connect said transistors to the resistive elements.

The principles of the present invention further provide for a substrate and transistor deposited on the substrate. An insulating layer may be disposed above the transistor. A resistive element may be disposed on the insulating layer above the transistor and at least two conductors may electrically connect the transistor in parallel with the resistive element.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE DRAWINGS

Figure 1:
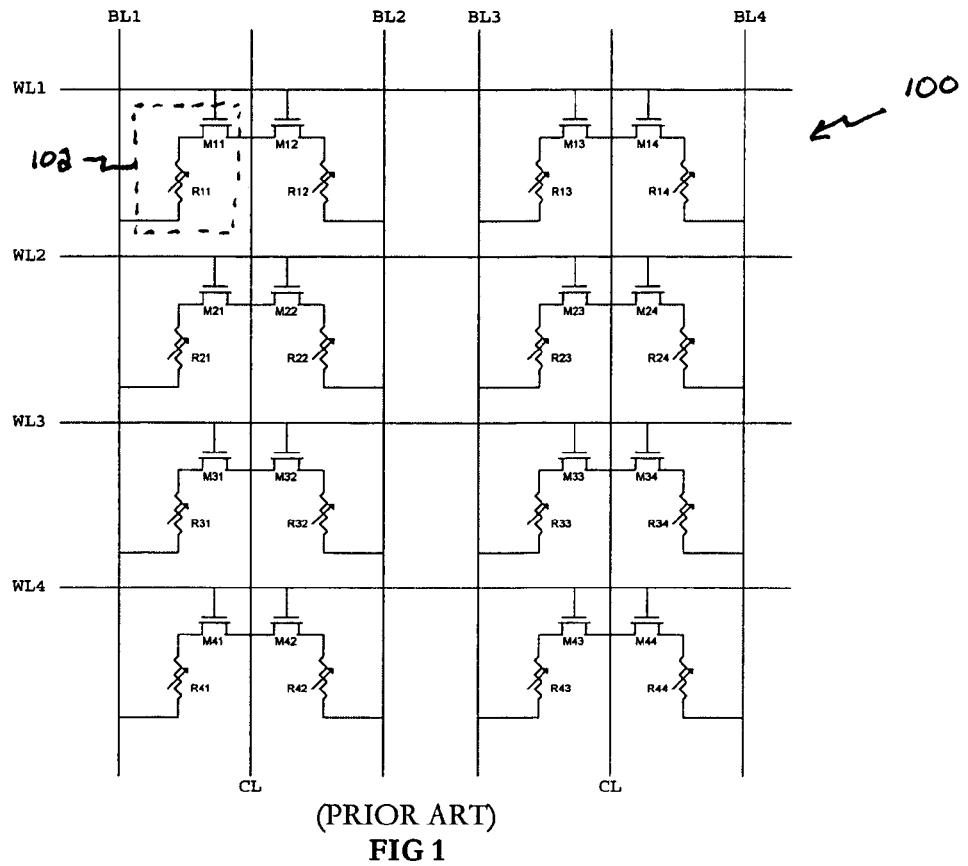
FIG. 1 is a schematic of a prior art resistive memory array.
Figure 2:
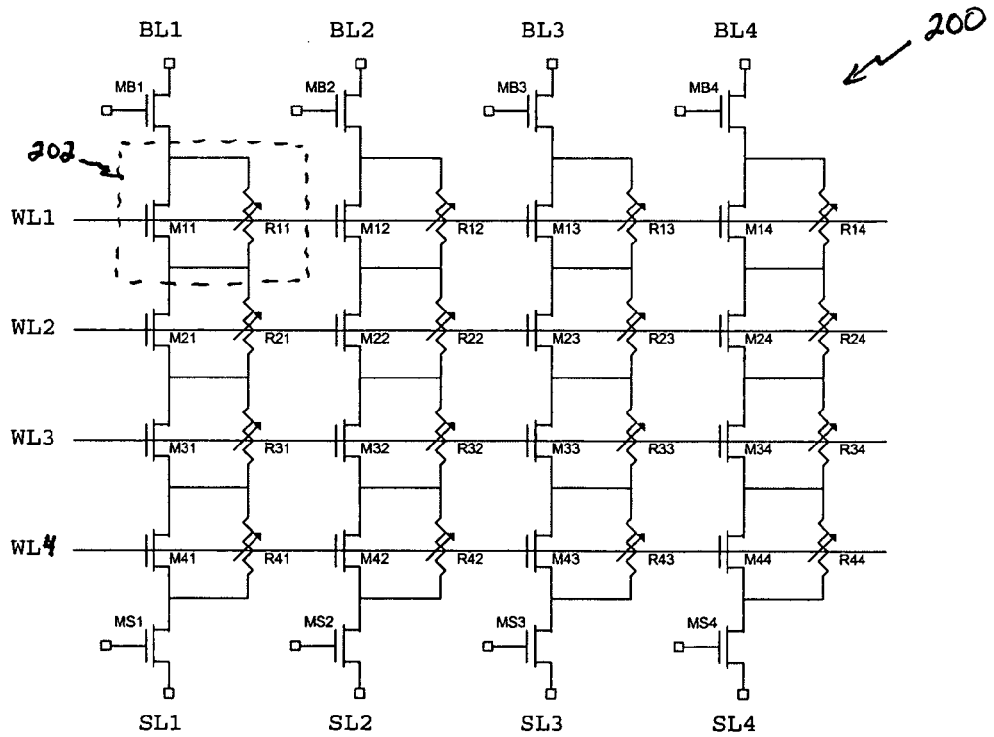
FIG. 2 is a schematic of an exemplary resistive memory array according to the principles of the present invention.

FIG. 2 is a schematic of an exemplary resistive memory array 200 according to the principles of the present invention. The memory array 200 is composed of memory cells 202 that include a resistive memory element R11 connected in parallel with a switch M11. In one embodiment, the switch M11 may be MOS transistor. Alternatively, other types of transistors may be utilized. The resistive memory element R11 may be formed of CMR, HTSC, or other resistive materials capable of having resistive characteristics altered by an external influence.

The memory array 200 may be configured by forming series or chains of memory cells 202. As shown, the chains of memory cells 202 may be connected along bit lines BL1-BL4. Word lines WL1-WL4 may be connected to memory cells 202 via gate terminals of the switches along respective memory cells 202. Each bit line may have a select switch MB1-MB4 and sense switch MS1-MS4 connected thereto used to control access to memory cells 202 along the corresponding bit lines BL1-BL4. For example, to access a memory cell 202 having switch M11, select switch MB1 and control switch MS1 are selectably turned on. Below control switch MS1 may be a sense amplifier (see, FIG. 9) that is used for reading data stored in the memory cells along the bit lines as understood in the art.

Figure 3:
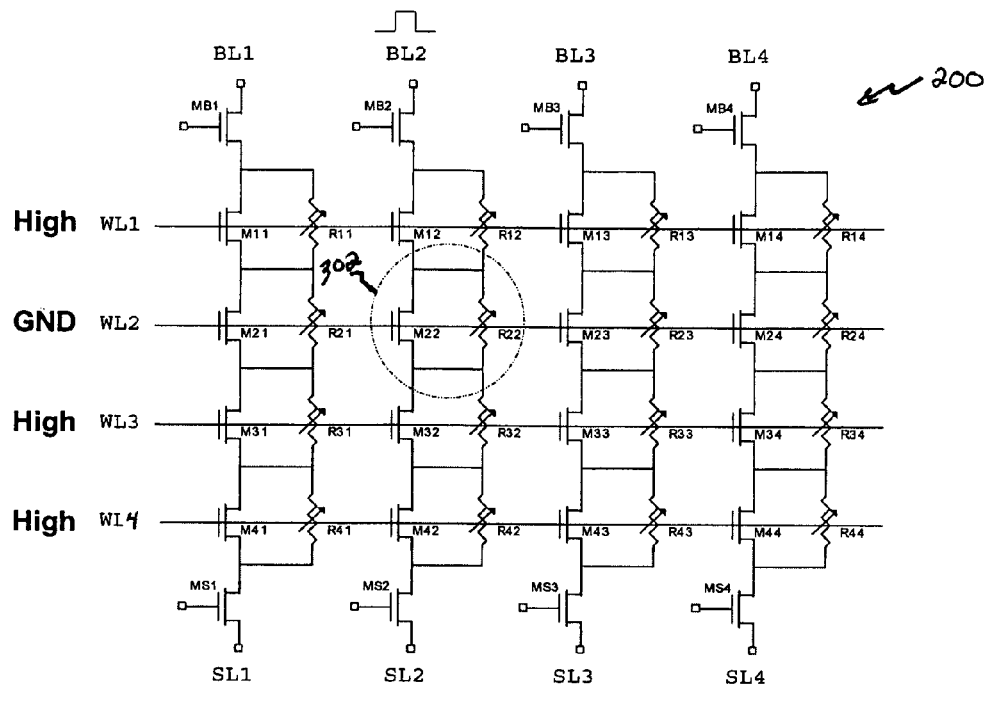
FIG. 3 is a schematic of the resistive memory array of FIG. 2 illustrating an exemplary technique for writing a logic high value into a resistive memory cell.

FIG. 3 is a schematic of the resistive memory array 200 of FIG. 2 illustrating an exemplary technique for writing a logic high level into a memory cell 302. In one embodiment, if a positive pulse is applied to the resistive element R22, the resistance increases. If a negative pulse or reverse polarity pulse is applied to the resistive element R22, the resistance decreases. The low resistance (LR) may be as low as 100 ohm to 10 k-ohm, and the high resistance (HR) may range from 50 k-ohm to 10 mega-ohm. The amount of change depends on the resistive material, deposition condition, film thickness and area. Another technique for changing the resistance of the resistive element R22 is to change the pulse amplitude and pulse width of a pulse being applied to the memory cell 302. For example, a 5 volt (5V) and 10 nanosecond (10 ns) pulse may be applied to the resistive element R22 to increase the resistance and a 3V and 4 microsecond ($\mu$s) pulse may be applied to the resistive element R22 to decrease the resistance. However, utilizing positive and reverse polarity pulses are generally a faster techniques for changing the resistance of a resistive element between a high and low logic level.

As previously described, the switches at the top and bottom of the bit lines BL1-BL4 are row/column select switches MB1-MB4 and sense switches MS1-MS4. The select switches MB1-MB4 and sense switches MS1-MS4 are used to select a certain bit and to separate the memory array 200 from external circuitry. For example, if memory cell 302 is to be selected, select switch MB2 and sense switch MS2 are turned on and the other select and sense switches are turned off. In addition, word line WL2 is grounded and each of the other word lines WL1, WL3-WL4 are turned high. By applying a low voltage onto word line WL2, switch M22 remains or is turned off so that current is forced through resistive element R22 connected in parallel to the switch M22. Because word lines WL1, WL3 and WL4 are high, each of the corresponding switches M12, M32, and M42, respectively, are turned on such that current flows through the switches and bypasses each of the resistive elements R12, R32, and R42, respectively connected in parallel. The process of being able to select one memory cell along a bit line enables random access writing and reading. While not writing to or reading from the memory array 200, select switches MB1-MB4 and sense switches MS1-MS4 may be turned off so that the memory array 200 is isolated from the external circuitry, thereby keeping electrical noise from the memory array 200. It should be understood that the memory array 200 is shown as a 4×4 chain array, and may be sized and dimensioned as desired, such as 128×128 or larger.

Figure 4:
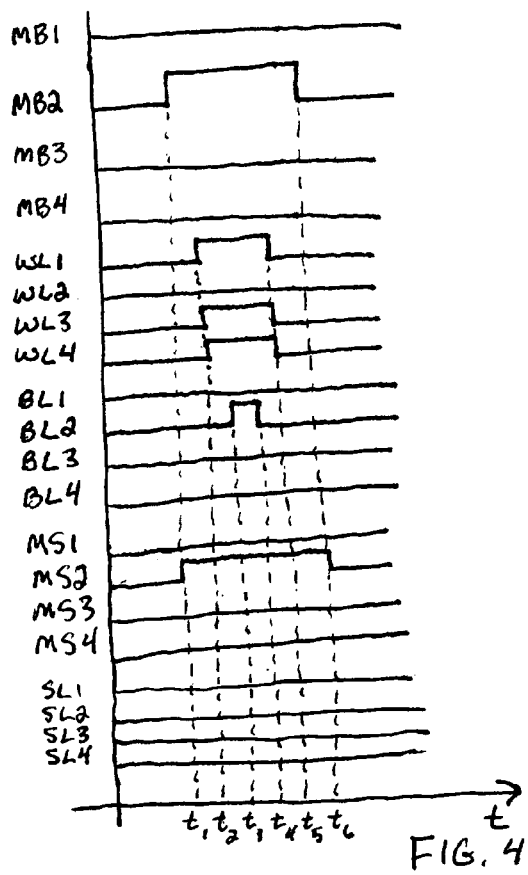
FIG. 4 is a timing diagram showing an exemplary technique for writing a logic high value into the resistive memory cell in the resistive memory array of FIG. 3.

FIG. 4 is a timing diagram showing an exemplary technique for writing a logic high into a memory cell 302 in the memory array 200 of FIG. 3. In writing a high value to memory cell 302, select switch MB2 and sense switch MS2 are turned on at time $t_1$ while other select switches MB1, MB3 and MB4 and sense switches MS1, MS3, and MS4 are turned off. At time $t_2$, word lines WL1, WL3, and WL4 are switched high while word line WL2 is maintained at a low voltage level so that memory switches M12, M32, and M42 are turned on and memory switch M22 is maintained off to cause current to flow through memory switches M12, M32 and M42, rather than the parallel resistive elements R12, R32, and R42, respectively. Accordingly, the current flows through resistive element R22 to enable data to be written into memory cell 302 via a pulse on bit line BL2. At time $t_3$, a positive pulse on bit line BL2 is applied to increase resistance of resistive element R22. In one embodiment, the positive pulse may be 5V in amplitude and 10 ns in duration. At time $t_4$, the pulse on bit line BL2 transitions low. At $t_5$, word lines WL1, WL3, and WL4 are transitioned low. Select switch MB2 and sense switch MS2 are transitioned low at $t_6$. At this point, the write cycle is complete and a high logic level is stored in the memory cell 302 by causing the resistive element R22 to have a high resistance value. It should be understood that the timing diagram in FIG. 4 is exemplary and that alternative timing may be utilized to write a high logic value to the memory cell 302.

Figure 5:
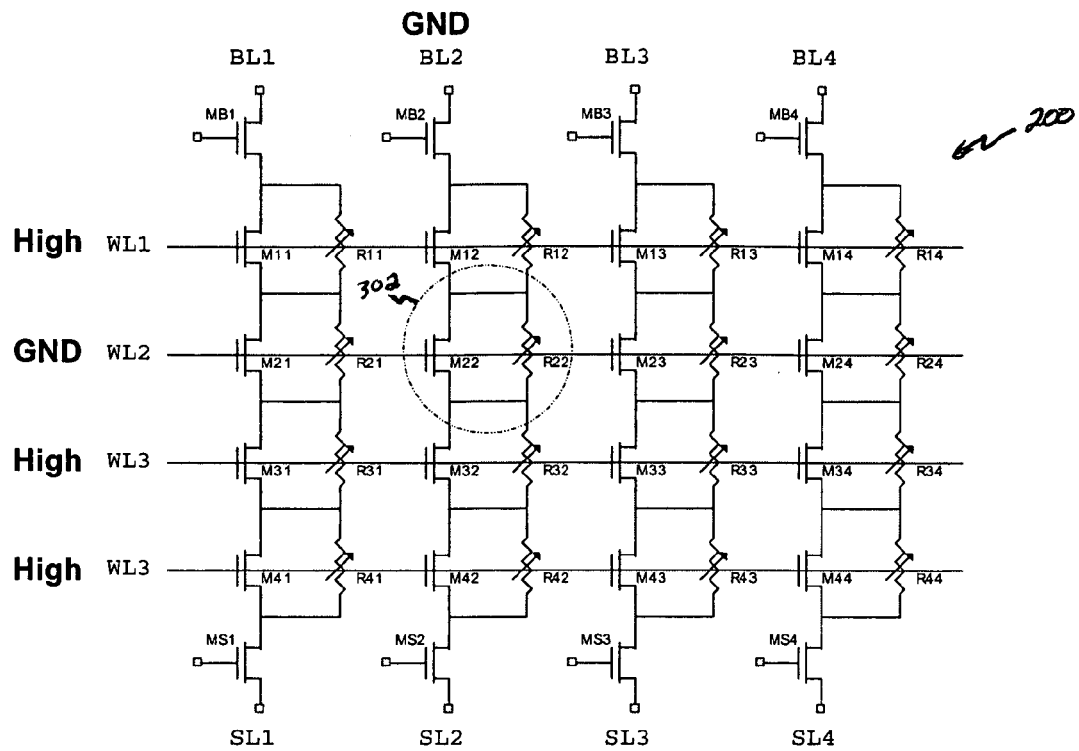
FIG. 5 is a schematic of the resistive memory array of FIG. 2 illustrating an exemplary technique for writing a logic low value into a resistive memory cell.

FIG. 5 is a schematic of the memory array of FIG. 2 illustrating an exemplary technique for writing a logic low value or "0" into a memory cell. To write a "0" into memory cell 302, a similar operation is performed as shown in FIGS. 3 and 4 with the exception that a pulse in the opposite polarity is applied to the memory cell 302. This causes the opposite effect as that of writing a "1" into the memory cell 302 described with respect to FIGS. 3 and 4 and causes resistance of the resistive element R22 to be lowered. It should be understood that the high and low resistance values of the resistive element R22 are relative and are used to enable a sense amplifier to sense a difference in current flow to determine whether a high or low logic level is stored in the memory cell.

Figure 6:
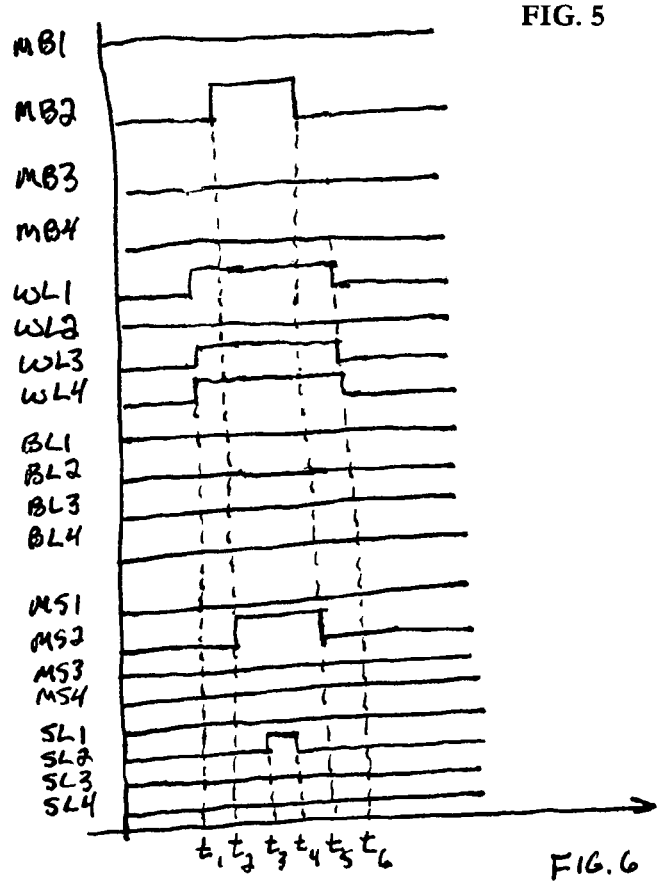
FIG. 6 is a timing diagram showing an exemplary technique for writing a logic low value into the resistive memory cell in the memory array of FIG. 3.

FIG. 6 is a timing diagram showing an exemplary technique for writing a logic low into the memory cell 302 in the memory array 200 of FIG. 5. The timing shown in FIG. 6 is slightly different from that shown in FIG. 4 to show that there may be several embodiments for writing data into a resistive memory cell according to the principles of the present invention. As shown, the word lines WL1, WL3, and WL4 are driven high at time $t_1$ to cause the current to flow through switches M12, M32 and M42, respectively. Word line WL2 remains low to cause current to flow through resistive element R22, which is being altered in resistance to write a "0" therein. At time $t_2$, select switch MB2 and sense switch MS2 are driven high. Between times $t_3$-$t_4$, bit line BL2 is grounded and sense line SL2 is pulsed, which causes resistive element R22 to transition from a high to a low resistance level. In one embodiment, the pulse may be 5V in amplitude and 10 ns in duration. At time $t_5$, the select and sense switches MB2 and MS2 are transitioned low and word lines WL1, WL3, and WL4 are transitioned low at time $t_6$, thereby ending the write cycle to store a low logic level in the memory cell 302.

Figure 7:
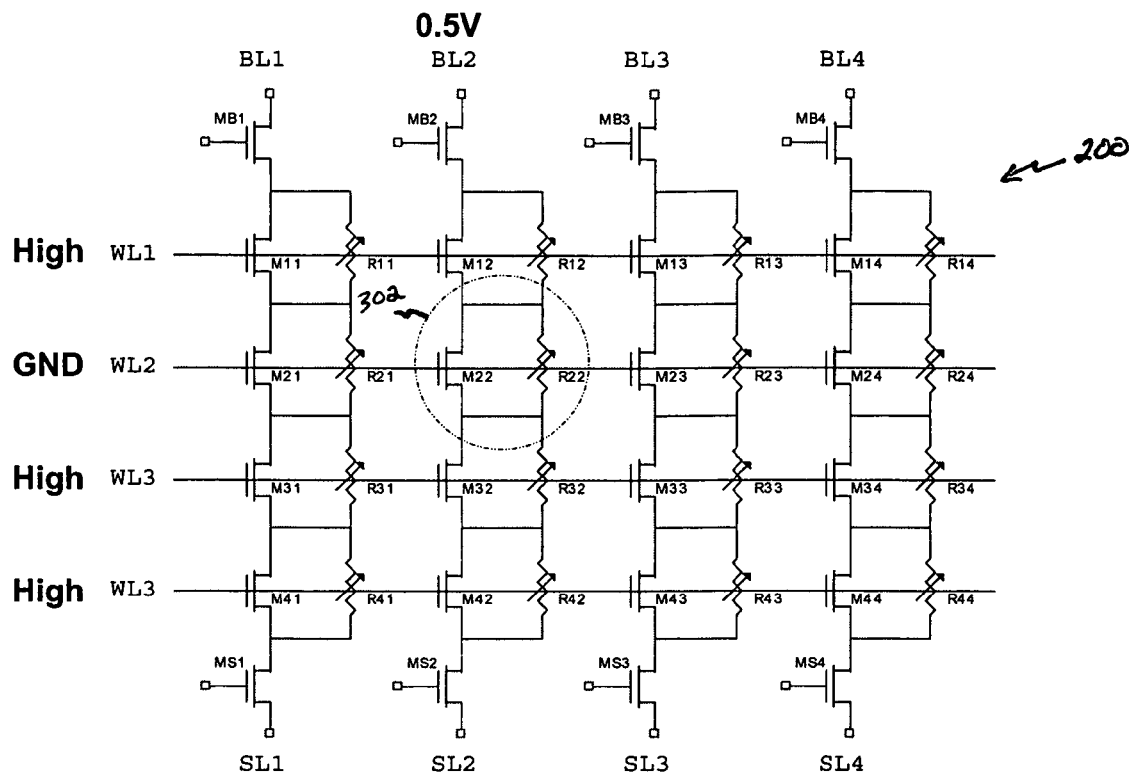
FIG. 7 is a schematic of the resistive memory array of FIG. 2 illustrating an exemplary technique for reading from a resistive memory cell.

FIG. 7 is a schematic of the memory array 200 of FIG. 2 illustrating an exemplary technique for reading from a memory cell. In reading a memory cell 302, the memory cell 302 is selected in the same manner as used in the write operation, but the voltage on bit line BL2 is low enough not to change the resistance of the resistive element R22. In one embodiment, the voltage applied to bit line BL2 is 0.5 volts. The sense line SL2 is connected to a sense amplifier (not shown), as understood in the art. Depending on the resistance of the resistive element R22 set by the write operation, the sense amplifier senses a different current and/or voltage to determine whether a high or low logic level (i.e., data value) was stored in the memory cell 302.

Figure 8:
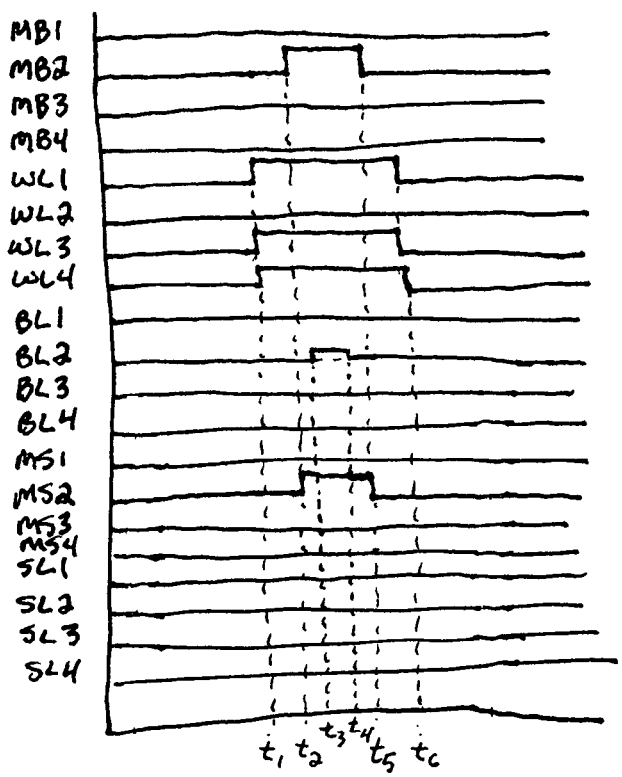
FIG. 8 is a timing diagram showing an exemplary technique for reading from a resistive memory cell of the resistive memory array of FIG. 2.

FIG. 8 is a timing diagram showing an exemplary technique for reading from a memory cell of the memory array of FIG. 2. At time $t_1$ word lines WL1, WL3, and WL4 are switched high to turn on switches M12, M32, and M42, respectively. Word line WL2 remains low to access the memory cell 302. At time $t_2$, selection switch MB2 and sense switch MS2 are turned on. During times $t_3$ and $t_4$, a low voltage pulse is applied to bit line BL2 to cause a current to flow through the resistive element R22. The current flowing through the resistive element R22 flows to the sense line SL2, which is connected to a sense amplifier. The sense amplifier is able to measure current and/or voltage, which is a function of a voltage drop across the resistive element R22 set or stored during a writing operation. At time $t_5$, the select and sense switches MB2 and MS2 are turned off. The word lines $WL_1$, $WL_3$, and $WL_4$ are turned off at time $t_6$, which ends the reading process. It should be understood that the timing shown in the timing diagram 800 may be different from that shown and still provide the same or equivalent functionality in accordance with the principles of the present invention.

Figure 9:
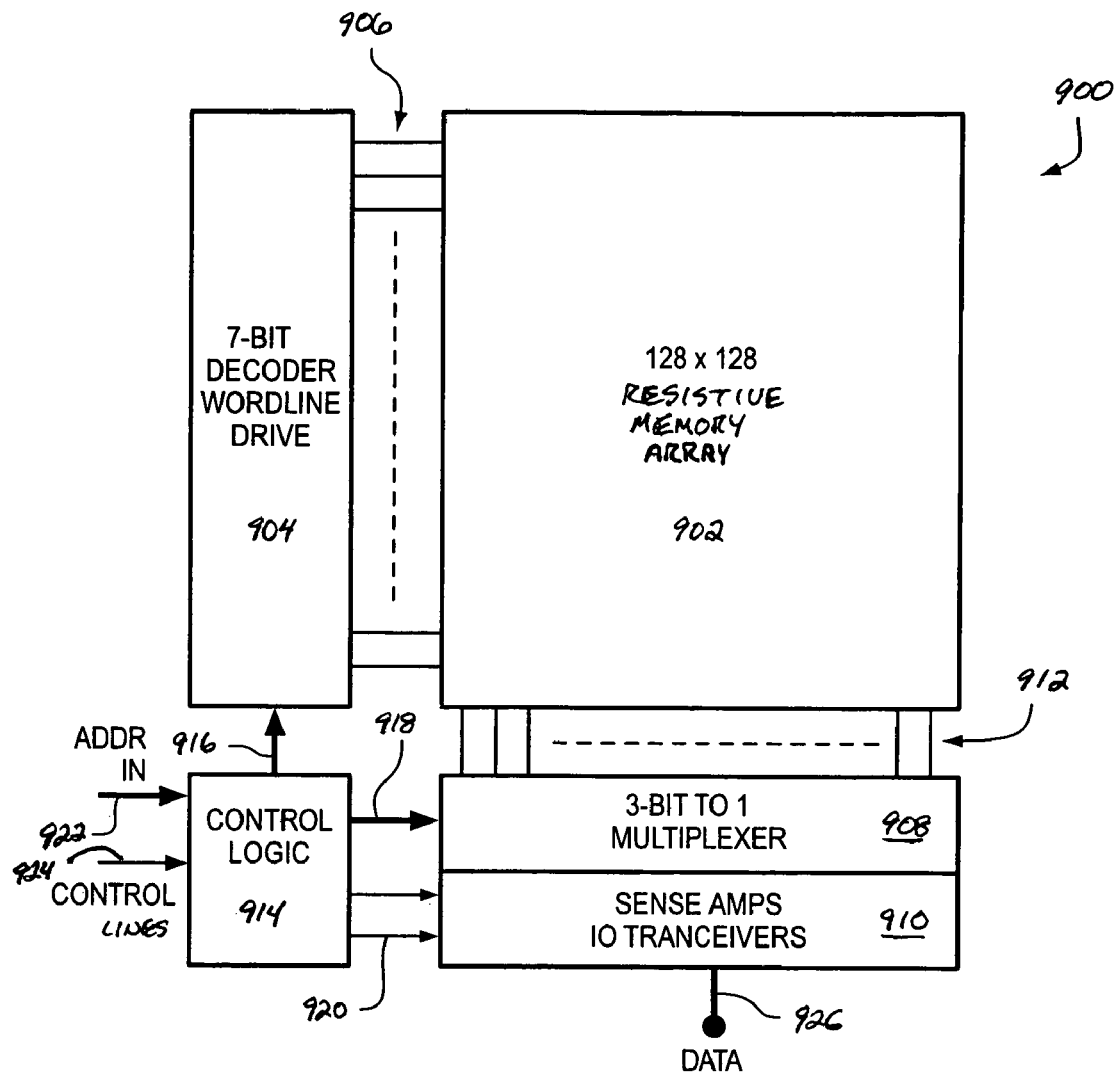
FIG. 9 is a block diagram of an exemplary resistive memory array according to the principles of the present invention connected to write and read circuitry.

FIG. 9 is a block diagram of a memory circuit 900 including an exemplary resistive memory array 902 according to the principles of the present invention connected to write and read circuitry. The memory circuit 900 includes a resistive memory array 902. In one embodiment, the resistive memory array 902 is formed of 128×128 memory cells. However, the resistive memory array 902 may have virtually any size as understood in the art. The resistive memory array 902 may be connected to a 7-bit decoder word line drive circuit 904 via word lines 906. The resistive memory array 902 may be further coupled to a 3-to-1 bit multiplexer 908 and sense amplifiers/input-output transistors 910 via bit lines 912. Control logic circuitry 914 may be in communication with (i) the decoder 904 via control lines 916, (ii) multiplexer 908 via control lines 918, and (iii) sense amplifier 910 via control lines 920. External input lines may include an address input line 922 and control lines 924. A data output line 926 may be used to output data from the memory circuit 900 via the sense amplifiers/transceivers 910.

In operation, an external processor (see, FIG. 10) may be used to drive the control logic 914. The control logic circuitry 914 communicates with the decoder 904, multiplexer 908, and sense amplifiers 910, which, in combination, are used to write data into the resistive memory array 902 and read data stored in the resistive memory array 902 as described in FIGS. 3-8.

Figure 10:
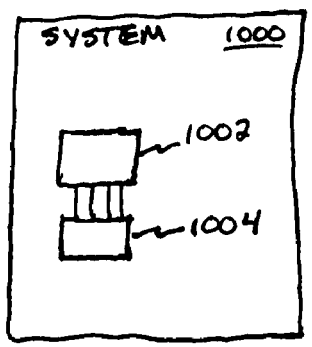
FIG. 10 is a block diagram of an exemplary system that includes a resistive memory array in accordance with the principles of the present invention.

FIG. 10 is a block diagram of an exemplary system 1000 that includes a resistive memory array in accordance with the principles of the present invention. The system 1000 may include a processor 1002 and resistive memory array 1004. The processor 1002 may communicate with the resistive memory array 1004 to write and read data thereto. The system may be any system that utilizes memory for data storage. For example, the system may be a computing device, communication device, storage device, or any other electronic device that utilizes memory for storage of information.

Figure 11A:
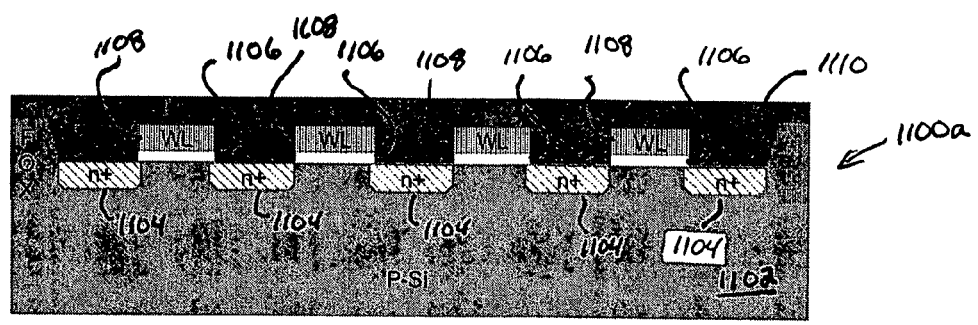
FIGS. 11A-11D are cross-section views as viewed through a bit line of an exemplary resistive memory array.

FIGS. 11A-11D are cross-section views as viewed through a bit line during a CMOS manufacturing process of an exemplary resistive memory array. FIG. 11A shows a first stage structure 1100a of the resistive memory array that includes a silicon substrate 1102 having ion implementation regions 1104 applied thereto after forming and etching a gate oxide layer 1106 grown over the substrate 1102. The combination of the ion implantation regions 1104 and gate oxide layer 1106 forms a transistor or switch, such as switch M22 (FIG. 2). Word lines 1108 may be deposited on the gate oxide layer 1106 (i.e., gate terminal of the transistor) for conducting current within the memory array 1100 and controlling switches that the word lines 108 are in contact. A silicon oxide ($SiO_2$) layer 1110 may be deposited over the substrate and word lines 1108.

Figure 11B:
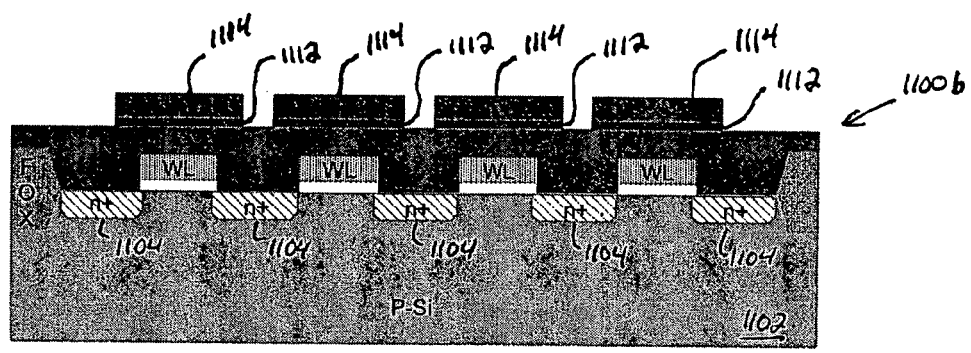

FIG. 11B shows a second stage structure 1100b of the memory array during the manufacturing process. In one embodiment, a buffer layer 1112 may be deposited on the $SiO_2$ layer 1110. The buffer layer 1112 is a non-conductive material as understood in the art. Above the buffer layer, resistive material 1114 may be deposited to form a resistor. The resistive material 1114 may be composed of colossal magnetoresistive material, high temperature superconductivity (HTSC) material, PCMO ($Pr_{0.7}Ca_{0.3}MnO_3$), or other resistive material. In one embodiment, the resistive material 1114 is deposited directly on the $SiO_2$ layer 1110. The resistive material may have physical dimensions of 45 nm to 1 μm length, 45 nm to 1 μm width, and 25 nm to 300 nm thickness.

Figure 11C:
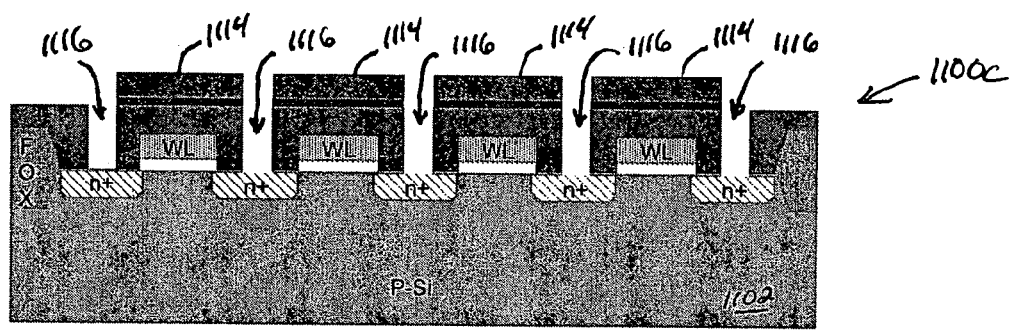
Figure 11D:
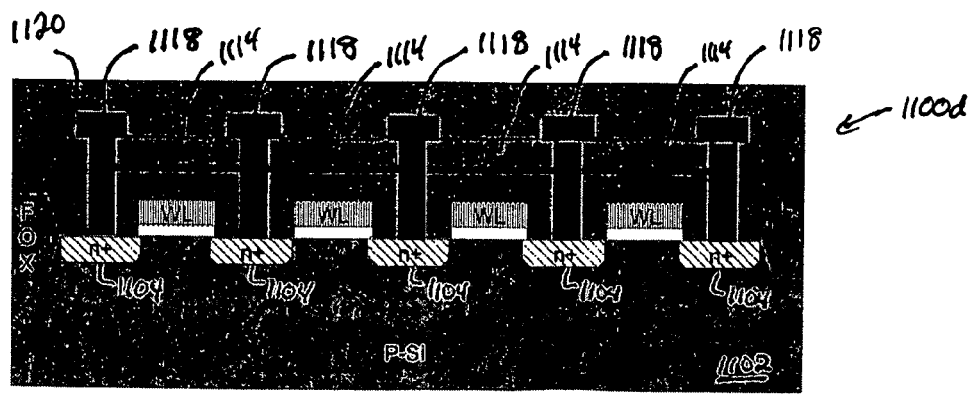

FIG. 11C is a cross-section view showing a third stage structure 1100c of the memory array having vias 1116 to expose the ion implantation regions 1104 in the substrate 1102. FIG. 11D is a cross-section view of a fourth stage structure 1100d of the memory array that includes metal plugs 1118 to operate as drain and source terminals of the switch and to connect the switch in parallel to the resistive material 1114. Another $SiO_2$ layer 1120 may be deposited thereon to insulate the metal plugs 1118.

Figure 12:
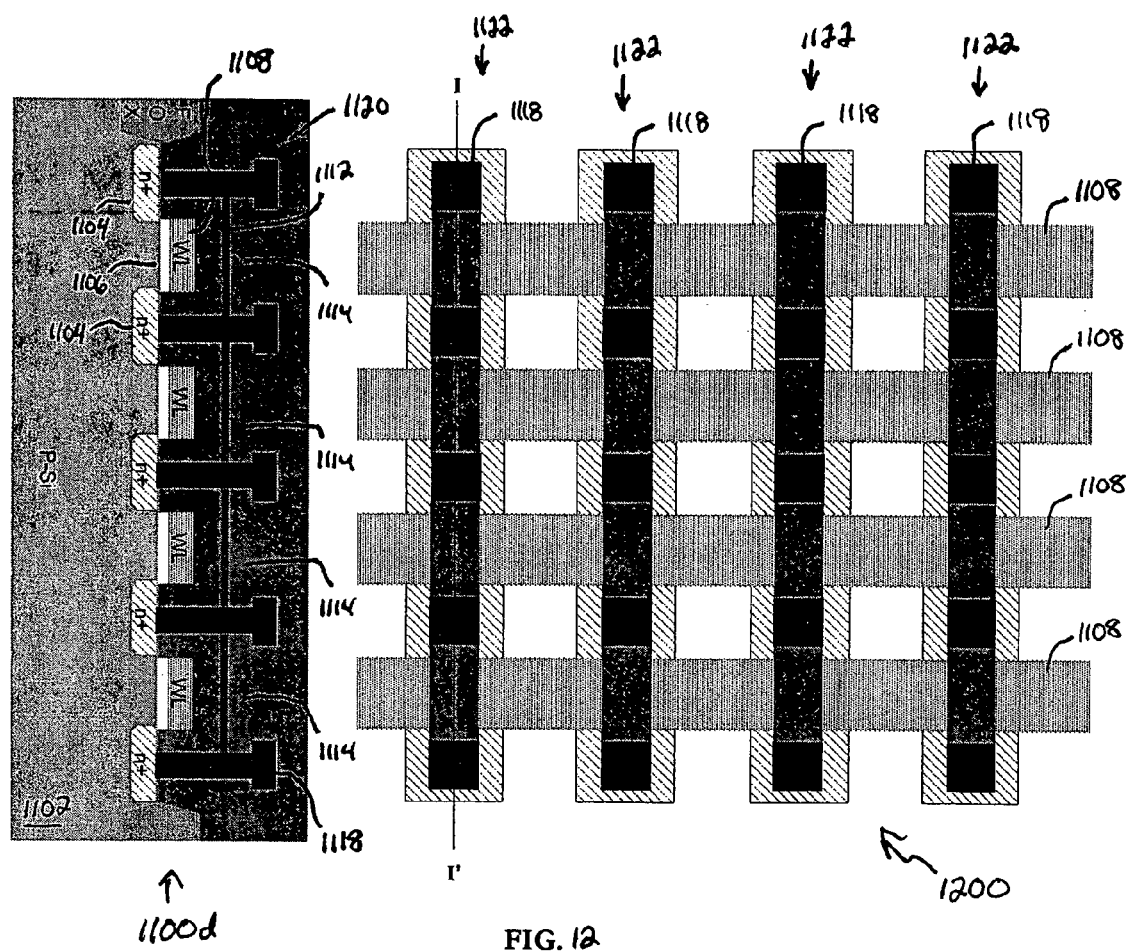
FIG. 12 is the cross-section view of FIG. 11D of a resistive memory array and a layout of a corresponding 4×4 chained 1T1R resistive memory array according to the principles of the present invention.

FIG. 12 is cross-section view of the fourth stage structure 1100d and a layout of a complete resistive memory array 1200 according to the principles of the present invention. The cross-section view reflects the resistive memory array along a line defined by I-I', which extends a long a bit line 1122. Because of the resistive material 1114 being in parallel with the transistor composed of the ion implantation regions 1104 and $CO_2$ oxide layer 1106, a memory cell may be as small as $4F^2$, where F is defined as feature size as understood in the art.

The particular systems, memory designs, and methods described herein are intended to illustrate the functionality and versatility of the invention, but the invention should not be construed to be limited to those particular embodiments. It is evident that those skilled in the art may make numerous uses and modifications of the specific embodiments described, or equivalent structures and processes may be substituted for the structures and processed described. For example, the memory is shown with the resistive elements and their associated transistors arranged in columns. The resistive elements may just as well have been arranged in rows. Thus, herein, the arrangement is referred to as a row/column arrangement. Since certain changes may be made in the above systems and methods without departing from the scope of the invention, it is intended that all subject matter contained in the above description or shown in the accompanying drawings may be interpreted as illustrative and not in a limiting sense, consequently, the invention is to be construed as embracing each and every novel feature and novel combination of features present or inherently possessed by the systems, devices, and methods described in the claims below and their equivalence.

We claim:

1. An electronic memory comprising a plurality of memory cells, each memory cell including:
    a switch;
    a resistive memory element connected in parallel with said switch, said resistive memory element capable of existing in one of a plurality of resistive states, each resistive state representing a different data state; and
    a memory write and read circuit selectably coupled to said resistive memory element and capable of writing a data state to said resistive memory element and reading the data state;
    wherein said plurality of memory cells are arranged in a row/column configuration, each row/column configuration including a plurality of said resistive memory elements connected in series and a plurality of said switches connected in series, each of said switches associated with one of said resistive memory elements; and
    said memory further comprising a source of a programming voltage and a row/column selection transistor connected between said source of the programming voltage and said row/column of memory cells.

2. The electronic memory according to claim 1, further comprising a sense amplifier and a row/column sense transistor connected between said sense amplifier and said row/column of memory cells.

3. The electronic memory according to claim 1, wherein said resistive memory element includes a material selected from the group consisting of colossal magnetoresistance (CMR) materials and high temperature superconductivity (HTSC) materials.

4. The electronic memory according to claim 1, wherein said resistive memory element is composed of $Pr_{0.7}Ca_{0.3}MnO_3$.

5. The electronic memory according to claim 1, wherein each of said memory cells has a maximum size of $4F_2$.

* * * * *